United States Patent
Narang et al.

(10) Patent No.: US 11,824,534 B2
(45) Date of Patent: Nov. 21, 2023

(54) TRANSMIT DRIVER ARCHITECTURE WITH A JTAG CONFIGURATION MODE, EXTENDED EQUALIZATION RANGE, AND MULTIPLE POWER SUPPLY DOMAINS

(71) Applicant: XILINX, INC., San Jose, CA (US)

(72) Inventors: Nakul Narang, Singapore (SG); Siok Wei Lim, Singapore (SG); Luhui Chen, Singapore (SG); Yipeng Wang, Singapore (SG); Kee Hian Tan, Singapore (SG)

(73) Assignee: XILINX, INC., San Jose, CA (US)

( * ) Notice: Subject to any disclaimer, the term of this patent is extended or adjusted under 35 U.S.C. 154(b) by 212 days.

(21) Appl. No.: 17/455,195

(22) Filed: Nov. 16, 2021

(65) Prior Publication Data

US 2023/0155591 A1 May 18, 2023

(51) Int. Cl.
*H04L 25/02* (2006.01)
*H03K 19/17736* (2020.01)
*G06F 13/10* (2006.01)
*H03K 19/17788* (2020.01)
*H04J 3/04* (2006.01)

(52) U.S. Cl.
CPC ..... *H03K 19/17744* (2013.01); *G06F 13/102* (2013.01); *H03K 19/17788* (2013.01); *H04J 3/047* (2013.01); *H04L 25/0272* (2013.01)

(58) Field of Classification Search
CPC ............. H03K 19/17788; H02J 7/0047; H04L 25/0272; G06F 13/102
See application file for complete search history.

(56) References Cited

U.S. PATENT DOCUMENTS

| | | |
|---|---|---|
| 8,549,057 B1 | 10/2013 | Hsieh et al. |
| 2002/0170011 A1* | 11/2002 | Lai ................ G01R 31/318577 714/727 |
| 2008/0192860 A1 | 8/2008 | Harwood et al. |
| 2015/0061756 A1 | 3/2015 | Sewani et al. |
| 2016/0191044 A1 | 6/2016 | Ikenaga |
| 2016/0341780 A1 | 11/2016 | McLeod et al. |
| 2018/0041232 A1 | 2/2018 | Lim et al. |
| 2018/0102797 A1 | 4/2018 | Lim et al. |
| 2018/0129082 A1 | 5/2018 | Lin et al. |
| 2019/0123728 A1 | 4/2019 | Zhao et al. |
| 2019/0386853 A1 | 12/2019 | Khan. P et al. |

* cited by examiner

*Primary Examiner* — Rahel Guarino (74) *Attorney, Agent, or Firm* — Patterson + Sheridan, LLP (57) ABSTRACT

A transmit driver architecture with a test mode (e.g., a JTAG configuration mode), extended equalization range, and/or multiple power supply domains. One example transmit driver circuit generally includes one or more driver unit cells having a differential input node pair configured to receive an input data signal and having a differential output node pair configured to output an output data signal; a plurality of power switches coupled between the differential output node pair and one or more power supply rails; a first set of one or more drivers coupled between a first test node of a differential test data path and a first output node of the differential output node pair; and a second set of one or more drivers coupled between a second test node of the differential test data path and a second output node of the differential output node pair.

19 Claims, 9 Drawing Sheets

TRANSMIT DRIVER ARCHITECTURE WITH A JTAG CONFIGURATION MODE, EXTENDED EQUALIZATION RANGE, AND MULTIPLE POWER SUPPLY DOMAINS

TECHNICAL FIELD

Examples of the present disclosure generally relate to electronic circuits and, more particularly, to a transmit driver circuit.

BACKGROUND

The use of high-speed serial communication links in electronic systems has continued to grow. In certain cases, serial links may be used for inter-integrated circuit (IC) communications within an electrical device (e.g., a serial bus between memory and a processing system) and/or between electrical devices (e.g., serial bus between a computer and a wearable device). In other cases, serial links may be used for inter-circuit communications within a system-on-a-chip (SoC). High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SerDes) may be used to transmit and receive data via a serial communication link. A SerDes transmitter serializes a multi-bit word into a serial data stream of corresponding bits. A SerDes receiver deserializes the received serial data stream into the original multi-bit word. In some SerDes systems, a clock signal is transmitted along with the serial data stream, whereas in other SerDes systems, the clock signal is instead embedded in the serial data stream.

SUMMARY

Certain aspects of the present disclosure generally relate to a transmit (TX) driver architecture, such as for a serializer/deserializer (SerDes) transmitter.

Certain aspects of the present disclosure provide a transmit driver circuit. The transmit driver circuit generally includes one or more driver unit cells having a differential input node pair configured to receive an input data signal and having a differential output node pair configured to output an output data signal; a plurality of power switches coupled between the differential output node pair and one or more power supply rails; a first set of one or more drivers coupled between a first test node of a differential test data path and a first output node of the differential output node pair; and a second set of one or more drivers coupled between a second test node of the differential test data path and a second output node of the differential output node pair.

Certain aspects of the present disclosure provide a method of driving data. The method generally includes receiving an input data signal at a differential input node pair of a driver unit cell of a transmit driver circuit; generating an output data signal using the driver unit cell; and outputting the output data signal at a differential output node pair of the transmit driver circuit. The transmit driver circuit generally includes a plurality of power switches coupled between the differential output node pair and one or more power supply rails; a first set of one or more drivers coupled between a first test node of a differential test data path and a first output node of the differential output node pair; and a second set of one or more drivers coupled between a second test node of the differential test data path and a second output node of the differential output node pair.

These and other aspects may be understood with reference to the following detailed description.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Certain aspects of the present disclosure generally relate to a transmit (TX) driver architecture, such as for a serializer/deserializer (SerDes) transmitter. The TX driver architecture may function as a current-mode driver in mission mode, but may support JTAG configuration as a voltage-mode driver at high data rates (e.g., at 128 Gbps). In addition, the TX driver architecture may have an extended equalization range, for both precursor and postcursor. In some examples, the TX driver architecture may have multiple power supply domains, as well as additional circuitry for increasing reliability, such as during a power-down mode.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example SerDes Circuit

Figure 1:
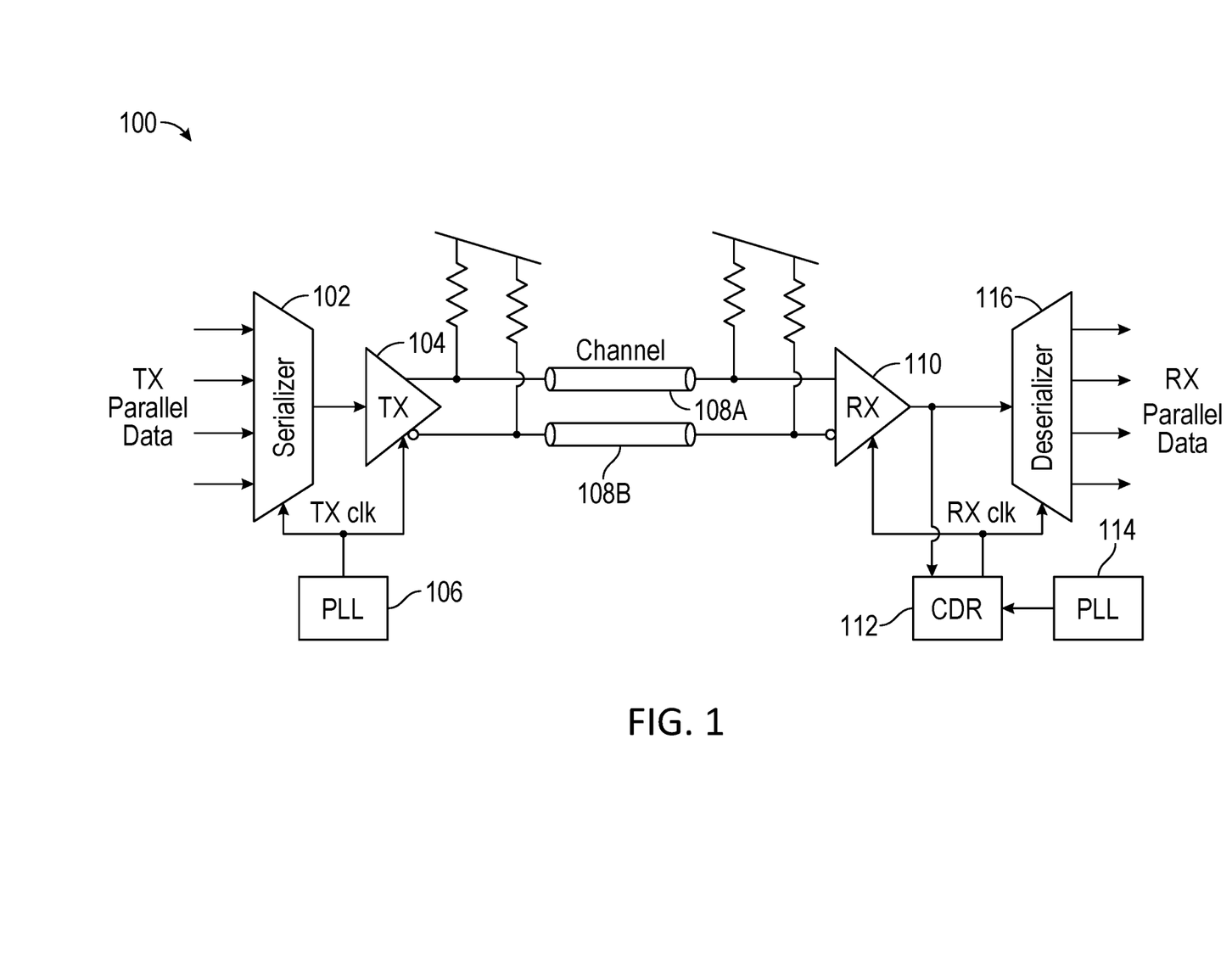
FIG. 1 is a block diagram of an example serializer/deserializer (SerDes) circuit having a SerDes transmitter and a SerDes receiver, in which aspects of the present disclosure may be practiced.

FIG. 1 is a block diagram of an example SerDes circuit 100, in which aspects of the present disclosure may be practiced. As shown, the SerDes circuit 100 may include a serializer 102, a SerDes transmitter 104 (labeled "TX"), a phase-locked loop (PLL) 106 for providing a transmit clock, a differential pair of serial channels 108A, 108B, a SerDes receiver 110 (labeled "RX"), a clock data recovery (CDR) circuit 112, a PLL 114 on the receive side, and a deserializer 116.

The serializer 102 converts data received on a parallel interface to a serial interface and provides a signal (e.g., a bitstream) of the serial data to the SerDes transmitter 104. The SerDes transmitter 104 may include a driver, which may amplify the serial data signal and output a differential signal on the serial channels 108A, 108B. The driver may be implemented as a voltage-mode driver or as a current-mode logic (CML) driver. In certain aspects, the SerDes transmitter 104 may also perform equalization to improve signal integrity of the SerDes circuit 100, such as by compensating (or at least adjusting) for loss in the channels 108A, 108B. The differential signal output by the SerDes transmitter 104 may be a low-voltage differential signal (LVDS), for example. In certain aspects, the serial channel 108A may carry the non-inverted signal of the differential pair, and the serial channel 108B may carry the inverted signal (i.e., the complementary signal) of the differential pair. In certain aspects, the differential signal output by the SerDes transmitter 104 may be sampled and generated according to the transmit clock output by the PLL 106. The PLL 106 may be used, for example, as a clock-synthesizer circuit that generates a high-speed master clock used for the serial data transmission.

The SerDes receiver 110 receives the differential signal of the serial data on the serial channels 108A, 108B and may amplify the received differential signal. In certain aspects, the SerDes receiver 110 may perform equalization of the received differential signal, in addition to the equalization performed by the SerDes transmitter 104. The CDR circuit 112 is coupled to the output of the SerDes receiver 110 and performs the timing recovery to recover the master clock used to sample the signals and generate a receive clock at the SerDes receiver 110. In certain aspects, the CDR circuit 112 may receive a reference clock signal via the PLL 114. The deserializer 116 converts the serial signal output by the SerDes receiver 110 to parallel form.

Signal integrity in transmission lines has been a design concern for many years and will remain so as data rates continue to increase for data traversing such transmission lines. As a signal travels between interconnects, electrical degradation of the signal may occur as the signal passes through different components. These waveform distortions may be caused by impedance mismatches like stubs and vias, frequency-dependent attenuation, and electromagnetic coupling between signal traces (e.g., crosstalk). As the designs get more sophisticated with additional channels being added to increase data rates, the overall signal integrity may become even more critical. An example contemporary serial link may use a SerDes on each end of the link, each endpoint having its own transmitter and receiver.

With the transmitter and receiver for a single SerDes circuit residing in different components, the transmitter and receiver may have differing types and amounts of equalization. Thus, the SerDes transmitter 104 and/or the receiver 110 may incorporate equalizers—such as a feed forward equalizer (FFE), a continuous time linear equalizer (CTLE), or a decision feedback equalizer (DFE)—to compensate, or at least adjust, for channel anomalies. Equalization methods can be linear or nonlinear. In microelectronic circuit implementation, the equalizer may be either continuous time (un-sampled) or discrete time (sampled). The signal amplitude can be discrete (digital) or continuous (analog). The equalizer may also be either adaptive or fixed, and the adaptive algorithm may be, for example, zero forcing (ZF), least mean squares (LMS) (or minimum-mean-square-error (MMSE)), or some nonlinear approach. In addition, the equalizer's target response may be either full response or partial response. The equalizer filter may be designed with either a finite impulse response (FIR) or an infinite impulse response (IIR) filter. Each equalization scheme has its pros and cons with respect to a specific application.

Transmit equalization (which may be used in field programmable gate arrays (FPGAs), for example, and may be referred to as "pre-emphasis")), pre-distorts a transmit signal by amplifying the high frequency content of the signal to compensate, or at least adjust, for the expected amount of loss through the channel. One of the most common techniques applied in the TX driver design for equalization is to add precursors and postcursors to the main signal. Generally, better signal integrity can be achieved with a higher range of equalization. The typical range of the precursors and postcursors is 0.28, but as the data rate increases (e.g., to 112 Gbps), higher pre/postcursor equalization may be implicated. Some examples of the present disclosure provide a greater range of equalization (up to 0.40), which provides enhanced signal integrity at higher data rates (e.g., at 112 Gbps).

Example TX Driver Architecture

Figure 2:
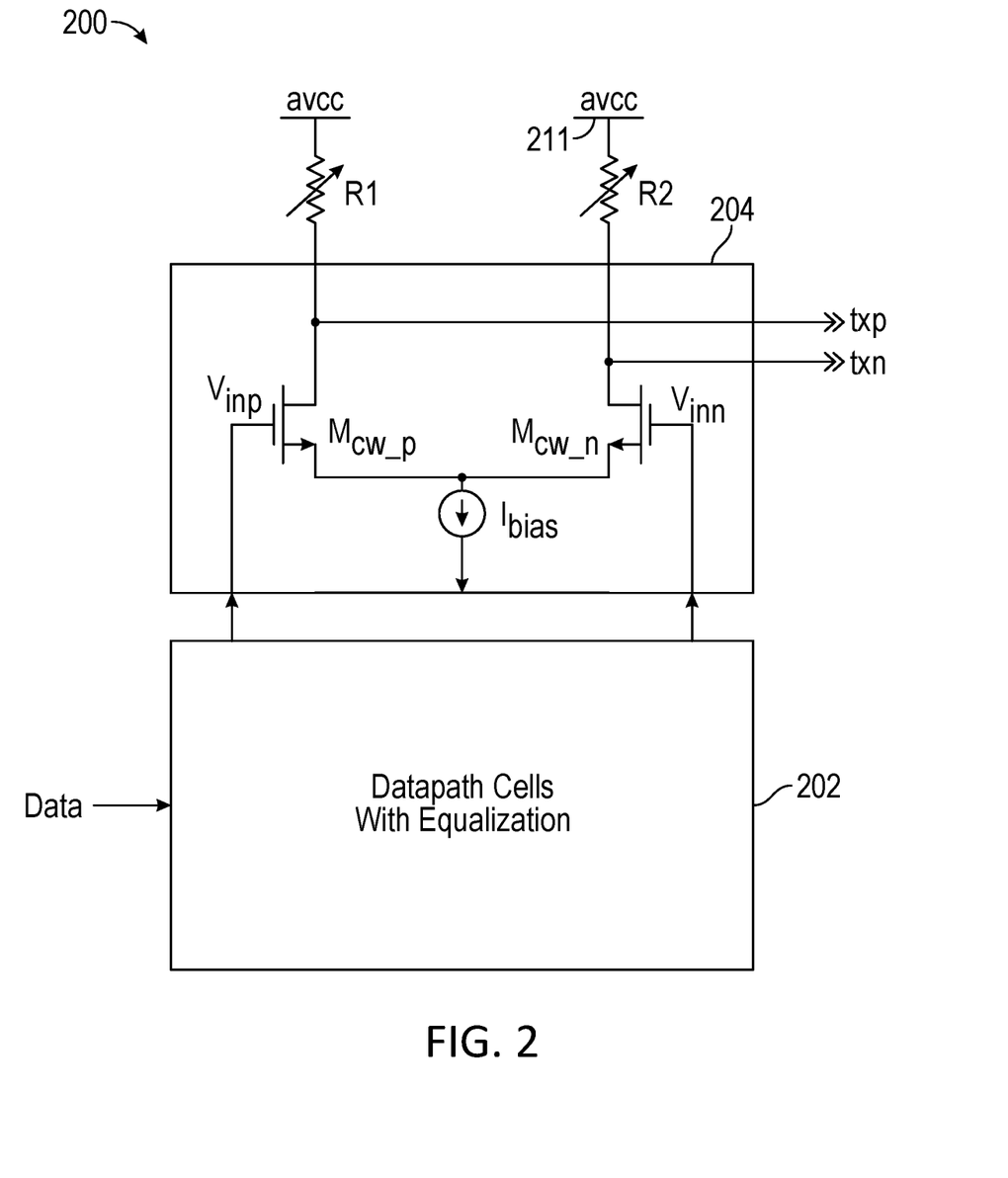
FIG. 2 is a block diagram of an example SerDes transmitter with a current-mode driver, according to certain aspects of the present disclosure.

FIG. 2 is a block diagram of an example SerDes transmitter 200 implemented with a current-mode driver, according to certain aspects of the present disclosure. The SerDes transmitter 200 may be used as a SerDes transmitter (e.g., SerDes transmitter 104) in a SerDes circuit (e.g., SerDes circuit 100). As illustrated in FIG. 2, the SerDes transmitter 200 includes one or more datapath cells 202, one or more driver unit cells 204, and a load composed of resistive elements R1, R2.

In certain aspects, the datapath cell(s) 202 may receive input data for transmission and perform signal processing on the received input data. For example, this signal processing may include modulation (e.g., to 4-level phase-amplitude modulation (PAM4)), equalization (e.g., using one or more multi-tap FIR filters), and/or digital-to-analog conversion (e.g., using one more current-steering digital-to-analog converters (DACs)). The datapath cell(s) 202 may output a differential voltage signal on a differential node pair (labeled "Vinp" and "Vinn") to the driver unit cell(s) 204. For certain aspects, the processed data may be buffered by one or more buffers (also referred to as pre-drivers) before being output to the driver unit cell(s) 204.

The driver unit cell(s) 204 may be implemented as a current-mode logic (CML) driver, as shown. The CML driver includes a differential transconductance stage configured to receive the differential voltage signal on the differential input node pair Vinp/Vinn and generate a differential output current on a differential output node pair (labeled "txp" and "txn"). As shown in FIG. 2, the transconductance stage may be implemented by n-type transistors Mcw_p and Mcw_n. The driver unit cell(s) 204 may also include a current sink (labeled "$I_{bias}$"), which may be coupled between sources of transistors Mcw_p and Mcw_n and a reference potential node (e.g., electrical ground) of the driver unit cell(s) 204. Gates of transistors Mcw_p and Mcw_n may be coupled to the differential input node pair Vinp/Vinn, respectively, and drains of transistors Mcw_p and Mcw_n may be coupled to the load resistive elements R1, R2. The resistive elements R1, R2 may also be coupled to a power supply rail 211 (labeled "avcc"). For some examples, the power supply rail 211 may have a voltage of 0.88 V. In certain aspects, the resistive elements R1, R2 are tunable. In this case, either or both of the resistive elements R1, R2 may be implemented by a switched array of resistive elements.

Although not shown in FIG. 2, the driver unit cell(s) 204 may also include inductive elements between the resistive elements R1, R2 and the differential output node pair. In certain aspects, the inductive elements may be coupled to electrostatic discharge (ESD) protection circuits for protection of the driver unit cell(s) 204 from ESD.

The Joint Test Action Group (JTAG) standard has been one of the most efficient and commonplace ways for allowing engineers and others to perform extensive debugging and diagnostics on a system using a small number of dedicated test pins. With JTAG, signals are serially scanned into and out of the input/output (I/O) cells of a device to control the device's inputs and test the device's outputs, sometimes under various conditions. One of the typical ways of implementing JTAG in the transmitter side is by adding additional datapaths inside the transmitter datapath that allows the data to be configurable between actual data and the test signal data. However, as data rates increase and designs get more complex, applying such additional datapaths for JTAG inside the datapath chain can consume excessive power, due to the additional load in the datapath. Some examples of the present disclosure may solve this issue by implementing a voltage-mode topology for the TX driver circuit in a test/debug mode (e.g., a JTAG mode) and a current-mode topology for the TX driver circuit in the mission mode, thereby avoiding degrading any performance of the datapath or the driver during mission mode.

Furthermore, as the TX driver architecture gets more complicated, reliability may be an increasingly relevant concern to ensure that the design does not have low yields during mass production or fail within a specified lifetime. Because a current-mode driver topology may experience a large voltage swing, the driver unit cell(s) may have a reliability issue under different swing conditions. Some examples of the present disclosure circumvent this issue by providing the TX driver circuit with two different power supply domains in an effort to avoid any large gate-to-source voltage (Vgs) or drain-to-source voltage (Vds) issues. In some examples, the TX driver circuit may also include certain switches to ensure reliability is maintained in various power sequence scenarios (e.g., in the power-down mode).

Example TX Driver with JTAG Configuration Support

As described above, some examples of the present disclosure provide a transmit (TX) driver circuit capable of operating with a voltage-mode topology in a test/debug mode (e.g., a JTAG mode) and with a current-mode topology in the mission mode, thereby avoiding degrading any performance of the datapath or the driver during mission mode and supporting a JTAG configuration at a 128 Gbps data rate, for example.

Figure 3A:
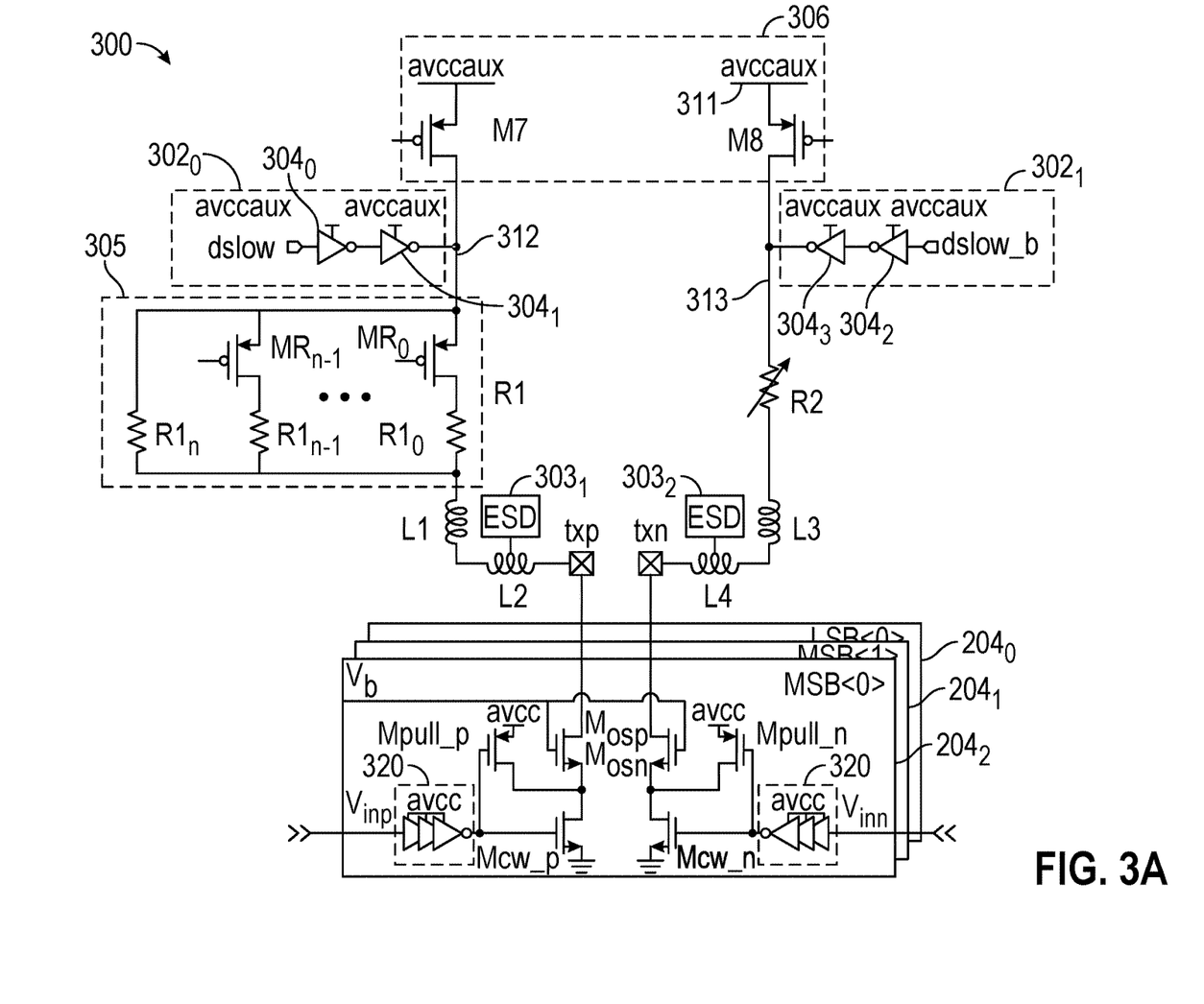
FIG. 3A is a circuit diagram illustrating an example implementation of a transmit driver circuit with JTAG inputs, according to certain aspects of the present disclosure.

FIG. 3A is a circuit diagram illustrating an example implementation of a transmit driver circuit 300 with JTAG input circuits $302_0$ and $302_1$ (collectively referred to herein as "JTAG input circuits 302"), according to certain aspects of the present disclosure. In addition to the JTAG input circuits 302, the transmit driver circuit 300 includes multiple driver unit cells 204, inductive elements L1, L2, L3, and L4, ESD protection circuits $303_1$ and $303_2$, resistive elements R1 and R2, and power switches 306.

JTAG input circuit $302_0$ includes a set of one or more drivers (e.g., buffers or inverters $304_0$, $304_1$), and JTAG input circuit $302_1$ includes a set of one or more drivers (e.g., buffers or inverters $304_2$, $304_3$). The inverters $304_0$, $304_1$, $304_2$, and $304_3$ are collectively referred to herein as "inverters 304." The inverters 304 have power inputs coupled to a power supply rail 311 (labeled "avccaux"). The input of inverter $304_0$ is coupled to a test datapath node (a first test node labeled "dslow") of a differential JTAG input node pair, and the input of inverter $304_3$ is coupled to a complementary test datapath node (a second test node labeled "dslow_b") of the differential JTAG input node pair. The output of inverter $304_0$ is coupled to the input of inverter $304_1$, and the output of inverter $304_1$ is coupled to node 312, which may be coupled to the txp node (e.g., via the resistive element R1 and inductive elements L1, L2). The output of inverter $304_2$ is coupled to the input of inverter $304_3$, and the output of inverter $304_3$ is coupled to node 313, which may be coupled to the txn node (e.g., via the resistive element R2 and inductive elements L3, L4).

In FIG. 3A, the resistive element R1 is implemented as a switched array of resistive elements 305 (also referred to as a "switched resistor array" or a "switched resistor network"). The switched array of resistive elements 305 includes n+1 branches, where n is a positive integer, where one branch includes a restive element R1n, and where the other branches include a resistive element (labeled "$R1_0$" to "$R1_{n-1}$") coupled in series with a respective p-type transistor (labeled "$MR_0$" to "$MR_{n-1}$"). By selectively turning on and off particular transistors, different resistances may be chosen for the resistive element R1, thereby implementing a tunable resistive element. Although not illustrated in FIG. 3A, resistive element R2 may be additionally or alternatively be implemented as a switched array of resistive elements, with the same number n or a different number of branches.

The power switches 306 may be coupled between the power supply rail 311 and the output nodes 312, 313 of the JTAG input circuits 302. The power switches 306 may be implemented by p-type transistors M7, M8, as illustrated in FIG. 3A. In this case, sources of transistors M7, M8 may be coupled to the power supply rail 311, and gates of transistors M7, M8 may be coupled to a power switch control node for a control signal to control operation of the transistors M7, M8. A drain of transistor M7 may be coupled to the output node 312, and a drain of transistor M8 may be coupled to the output node 313.

As described above, the transmit driver circuit 300 may support PAM4. As such, the transmit driver circuit 300 includes three driver unit cells 204: driver unit cell $204_0$ for LSB<0>, driver unit cell $204_1$ for MSB<1>, and driver unit cell $204_2$ for MSB<0>. The three driver unit cells 204 may be replicated versions of one another. Each driver unit cell may include pre-drivers 320, n-type transistors Mcw_p and Mcw_n (as described above with respect to FIG. 2), pull-up p-type transistors Mpull_p and Mpull_n, and current sink n-type transistors Mcsp and Mcsn, biased with a control signal labeled Vb,mn. The reader is to understand that the transmit driver circuit may include more or less than three driver unit cells 204.

With the JTAG input circuits 302 and the power switches 306 configured as shown in the transmit driver circuit 300 of FIG. 3A, the JTAG input circuits 302 may be disabled or powered down when not in use (e.g., during mission mode), and the transmit driver circuit 300 may function as a current-mode driver and receive power from the power supply rail 311 to generate the differential output currents at the differential output node pair txp/txn. The load capacitance may be high at the differential output node pair txp/txn, so the additional load of the JTAG input circuits 302 may have no significant impact on the driver performance in the mission mode.

Figure 3B:
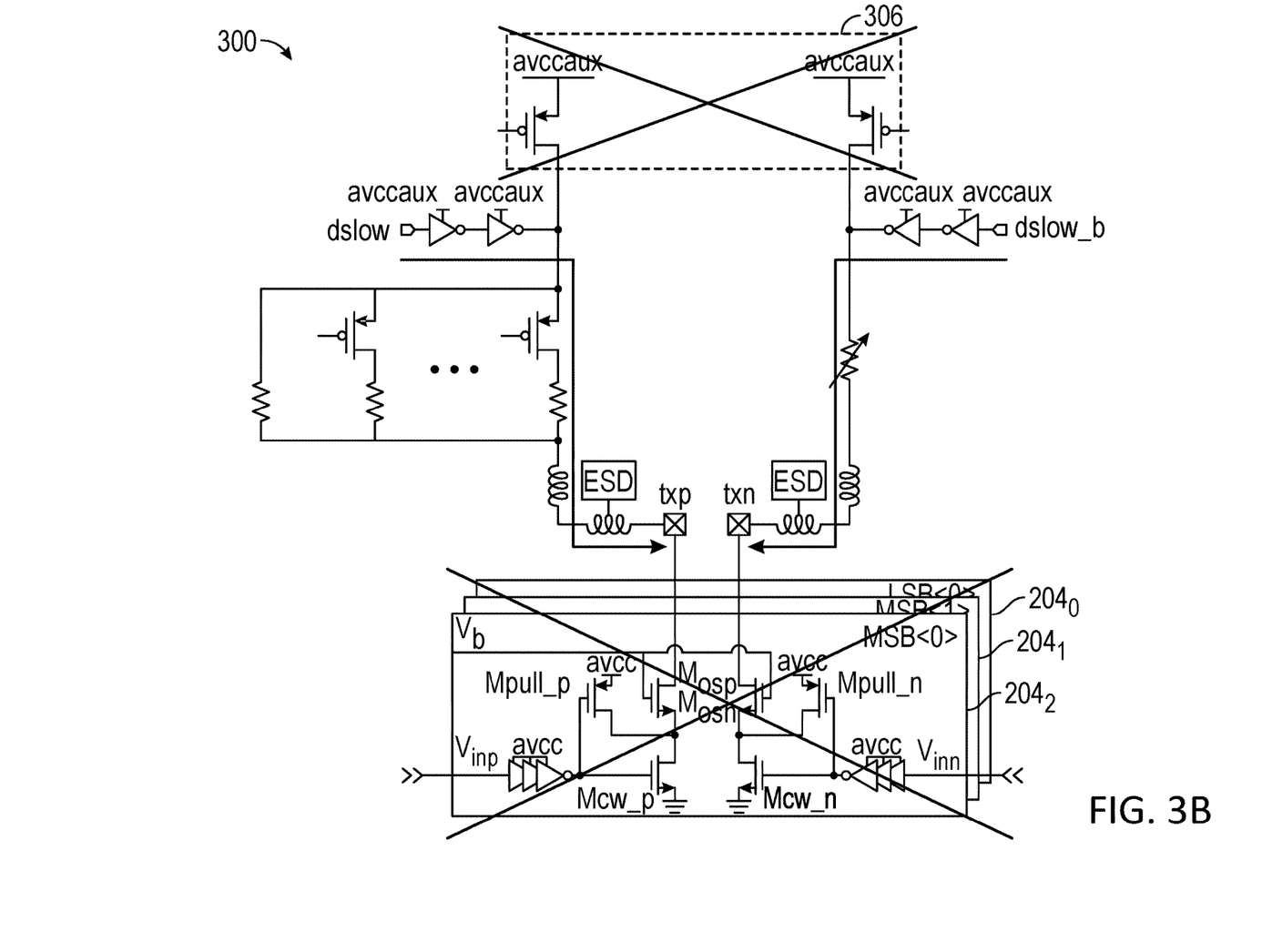
FIG. 3B illustrates example operation of the transmit driver circuit of FIG. 3A during a JTAG mode, according to certain aspects of the present disclosure.

FIG. 3B illustrates example operation of the transmit driver circuit 300 of FIG. 3A during a JTAG mode, according to certain aspects of the present disclosure. During the JTAG mode, the power switches 306, the driver unit cells 204, and the datapath cell(s) 202 may be turned off or otherwise effectively disabled as shown in FIG. 3B. In this manner, testpath data in the JTAG mode is input via the JTAG input circuits 302 with test datapath nodes dslow/dslow_b, rather than through the datapath cell(s) 202, and the transmit driver circuit 300 functions as a voltage-mode driver through the inverters 304, the resistive elements R1, R2, and the inductive elements L1-L4 to the differential output node pair txp/txn. This voltage-mode JTAG configuration may allow the testpath to operate at maximum efficiency.

Example TX Driver with Switches for Multiple Supply Domains and Reliability

As described above, because the current-mode driver architecture supports a relatively large voltage swing, there may be a reliability concern with the driver unit cell(s) 204 due to the large drain-to-source voltage (Vds) seen by the driver unit cell(s). Some examples of the present disclosure provide a transmit (TX) driver circuit with two different power supply domains in an effort to avoid any large gate-to-source voltage (Vgs) or Vds issues.

Figure 3C:
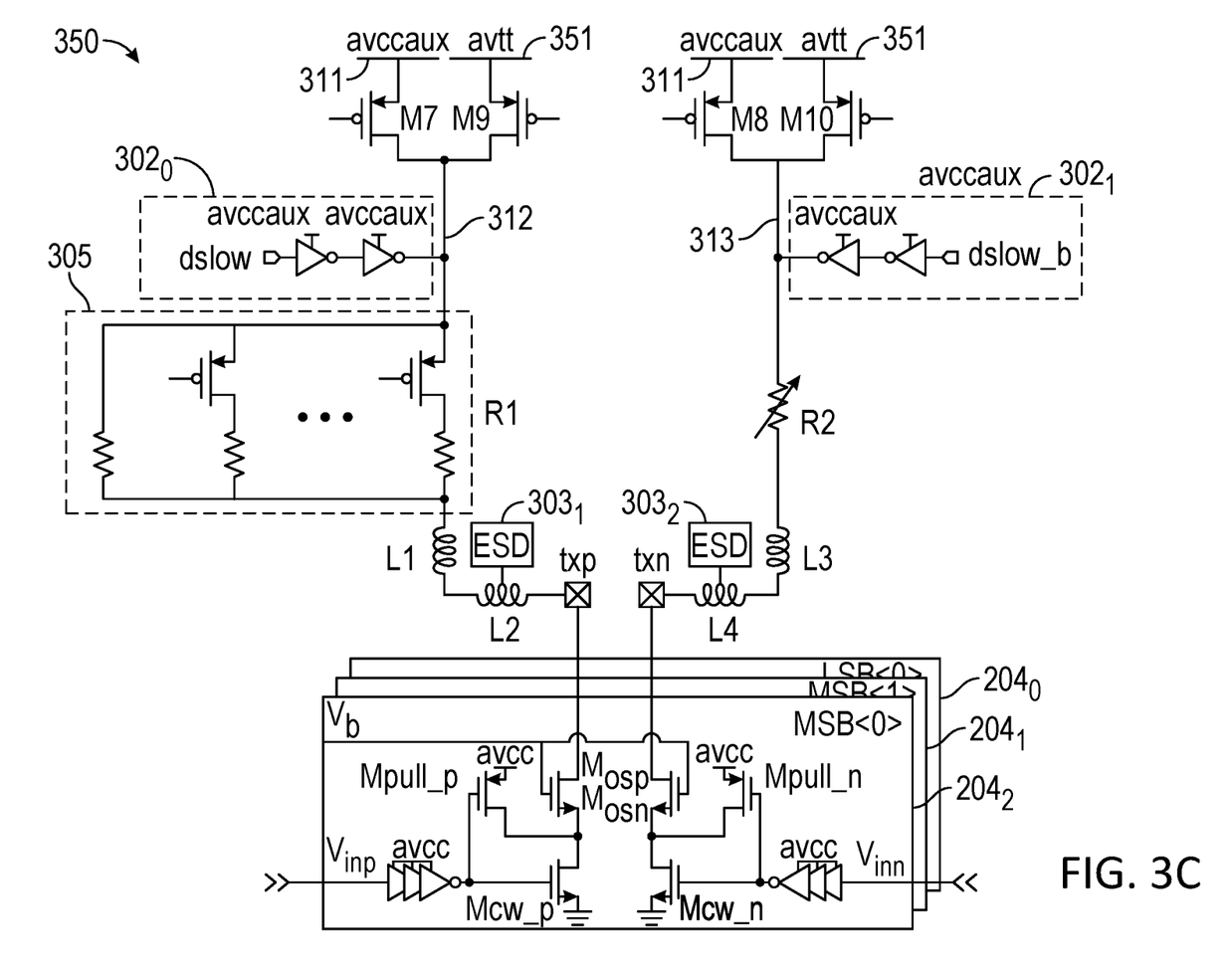
FIG. 3C is a circuit diagram illustrating an example implementation of a transmit driver circuit with multiple power supply domains and power switches, according to certain aspects of the present disclosure.

FIG. 3C is a circuit diagram illustrating an example implementation of a transmit driver circuit 350 with multiple power supply domains and multiple power switches in each branch, according to certain aspects of the present disclosure. The transmit driver circuit 350 is similar to the transmit driver circuit 300 of FIG. 3A, although the JTAG input circuits 302 are optional in the transmit driver circuit 350 of FIG. 3C. The transmit driver circuit 350 includes the p-type transistors M7 and M8 coupled between the power supply rail 311 (labeled "avccaux") and the nodes 312, 313, respectively. The transmit driver circuit 350 also includes an additional power supply rail 351 (labeled "avtt") and p-type transistors M9 and M10 coupled between the power supply rail 351) and the nodes 312, 313, respectively.

The power supply rail 311 may have a larger voltage than the power supply rail 351. For example, the power supply rail 311 may have an (avccaux) voltage of 1.5 V, and the power supply rail 351 may have an (avtt) voltage of 1.2 V. During operation of the transmit driver circuit 350, the nodes 312, 313 may be coupled to the power supply rail 311 via transistors M7 and M8 in relatively large swing scenarios (e.g., the Vds of the driver unit cell(s) 204 is >0.8 V). In smaller swing scenarios (e.g., Vds<0.8 V), however, the nodes 312, 313 may be coupled to the power supply rail 351 via transistors M9 and M10. Such operation not only saves power under low swing conditions, but improves reliability (in large and small swing scenarios) and prevents the driver unit cell(s) 204 from breaking down over time.

Figure 3D:
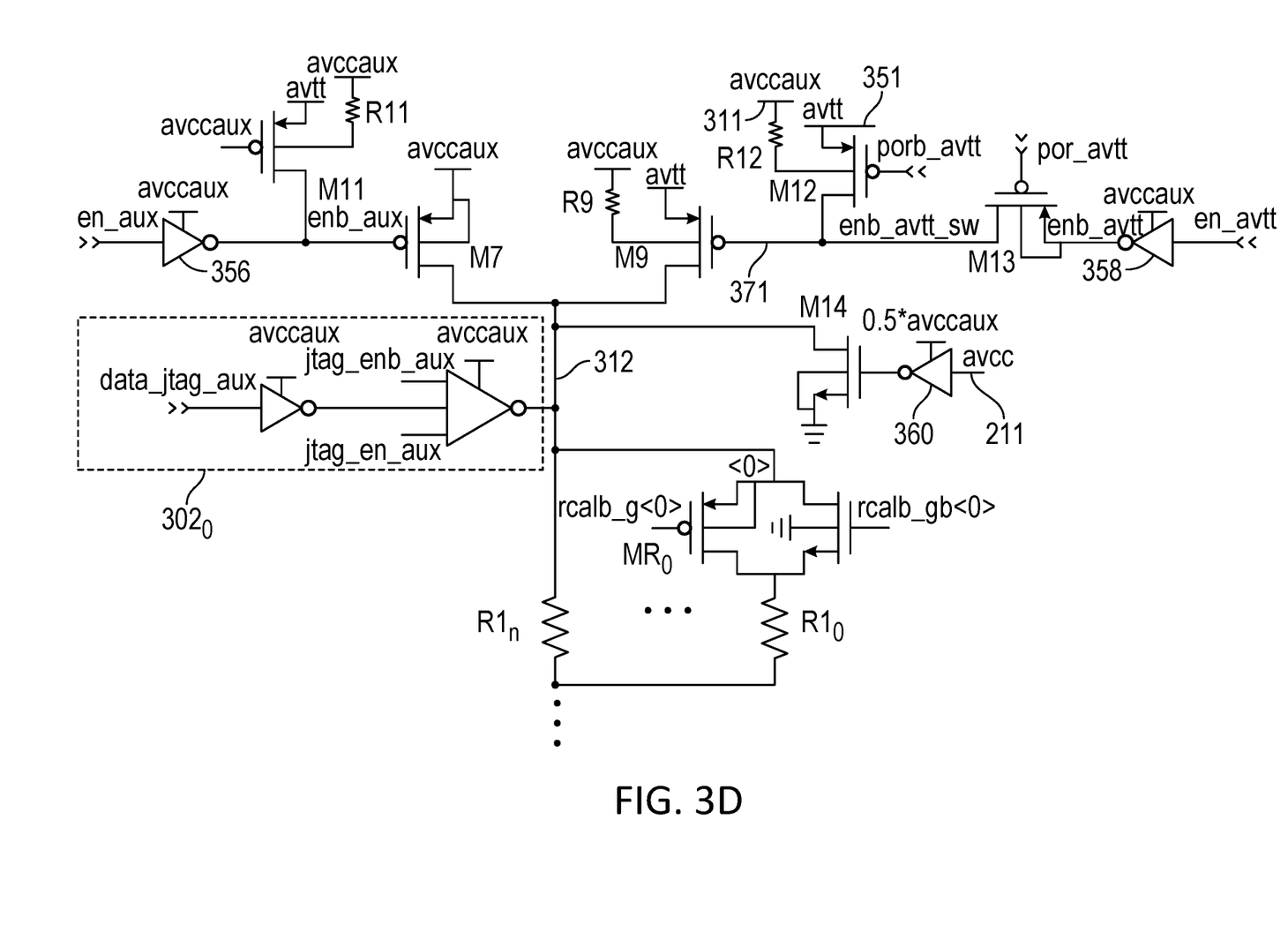
FIG. 3D is a circuit diagram illustrating the power switches of FIG. 3C and additional switches for reliability during power-down mode for the transmit driver circuit, according to certain aspects of the present disclosure.

It may be desirable to ensure that the transmit driver circuit has no reliability issues during power-down mode, as well, while the transmit driver circuit is being powered down. Therefore, the power switches (e.g., transistors M7, M8, M9, and M10) may be designed using thick oxide transistors. Furthermore, certain switches may be added to the transmit driver circuit 350 in an effort to maintain reliability in the power-down mode, as illustrated in FIG. 3D. For example, one branch (including node 312) of the transmit driver circuit in FIG. 3D includes p-type transistors M11, M12, and M13 and inverters 356 and 358. This same branch of the transmit driver circuit in FIG. 3D also includes n-type transistor M14 and inverter 360. It is to be understood that these components may be duplicated for the other branch (including node 313) of the transmit driver circuit.

As illustrated in FIG. 3D, p-type transistor M7 has a source and a body coupled to the power supply rail 311 (labeled "avccaux"), a drain coupled to the node 312, and a gate coupled to the output (labeled "enb_aux") of the inverter 356. The data input of the inverter 356 receives an input labeled "en_aux," and the power input of the inverter 356 is coupled to the power supply rail 311. In this manner, transistor M7 may be turned on when en_aux is asserted. Transistor M11 has a source coupled to the power supply rail 351 (labeled "avtt"), a body coupled to the power supply rail 311 via a pull-up resistor R11, a gate coupled to the power supply rail 311, and a drain coupled to the output of the inverter 356. Therefore, transistor M11 may be used to prevent any significant leakage current in the transmit driver circuit through the power switch circuit associated with transistor M7 in the power-down mode.

Furthermore, transistor M11 may be used to prevent significant leakage during a power bring-up scenario where the order of voltages avccaux and avtt on power supply rails 311 and 351, respectively, being brought up may be random. For a scenario where avtt is on (e.g., at 1.2 V), but avccaux is still off (e.g., at 0 V), for example, transistor M11 may be used to pull the gate of transistor M7 up to avtt and prevent significant leakage through transistor M7 that might otherwise occur without transistor M11 in this scenario.

P-type transistor M9 has a source coupled to the power supply rail 351, a body coupled to the power supply rail 311 via a pull-up resistor R9, a drain coupled to the node 312, and a gate coupled to a node 371 (labeled "enb_avtt_sw"). Transistor M12 has a source coupled to the power supply rail 351, a body coupled to the power supply rail 311 via a pull-up resistor R12, a gate coupled to a complementary power-on-resist control node (labeled "porb_avtt"), and a drain coupled to node 371. Transistor M13 has a drain coupled to node 371, a gate coupled to a power-on-resist control node (labeled "por_avtt"), and a source and a body coupled to the output of the inverter 358 (labeled "enb_avtt"). The data input of the inverter 358 receives an input labeled "en_avtt," and the power input of the inverter 358 is coupled to the power supply rail 311.

Transistor M14 has a drain coupled to node 312, a source and a body coupled to the reference potential node (e.g., electrical ground) for the transmit driver circuit, and a gate coupled to an output of the inverter 360. The inverter 360 has a data input coupled to the power supply rail 211 (labeled "avcc") and a power input coupled to a voltage at approximately one half the avccaux voltage (e.g., 0.75 V). In this manner, transistor M14 is used to ensure that the output voltage at the differential output node pair txp/txn is avccaux/2 in the power-down mode to avoid any reliability issues due to large Vds for the driver unit cell(s) 204 while powering down the transmit driver circuit. The gate voltage of the transistors in the switched array of resistive elements may be in the avccaux voltage domain to avoid large Vgs issues during power down of the transmit driver circuit.

Example TX Driver with Extended Precursor and Postcursor Range

As presented above, some examples of the present disclosure provide transmit driver architecture with a greater range of equalization (up to 0.40), which provides enhanced signal integrity at higher data rates (e.g., at 112 or 224 Gbps). As illustrated in the block diagram 400 and the table 420 of FIG. 4, the transmit driver architecture (and more specifically, the datapath cell(s) 202 of FIG. 2, for example) may include a control module 402 for controlling transmit driver swing and equalization (e.g., using a finite impulse response (FIR) filter). This architecture uses two main cursor slices 408, 406 (labeled "Main0" and "Main1," respectively), one postcursor slice 404 (labeled "Post1"), and three precursor slices 410, 412, 414 (labeled "Pre1," "Pre2," and "Pre3," respectively), which are controlled by the control module 402. The control module 402 and the (pre-/post-) cursor slices 404, 406, 408, 410, 412, and 414 may be implemented in a digital signal processor (DSP), field programmable gate array (FPGA) or other programmable logic device, an application specific integrated circuit (ASIC), or a general purpose processor, for example.

Figure 4:
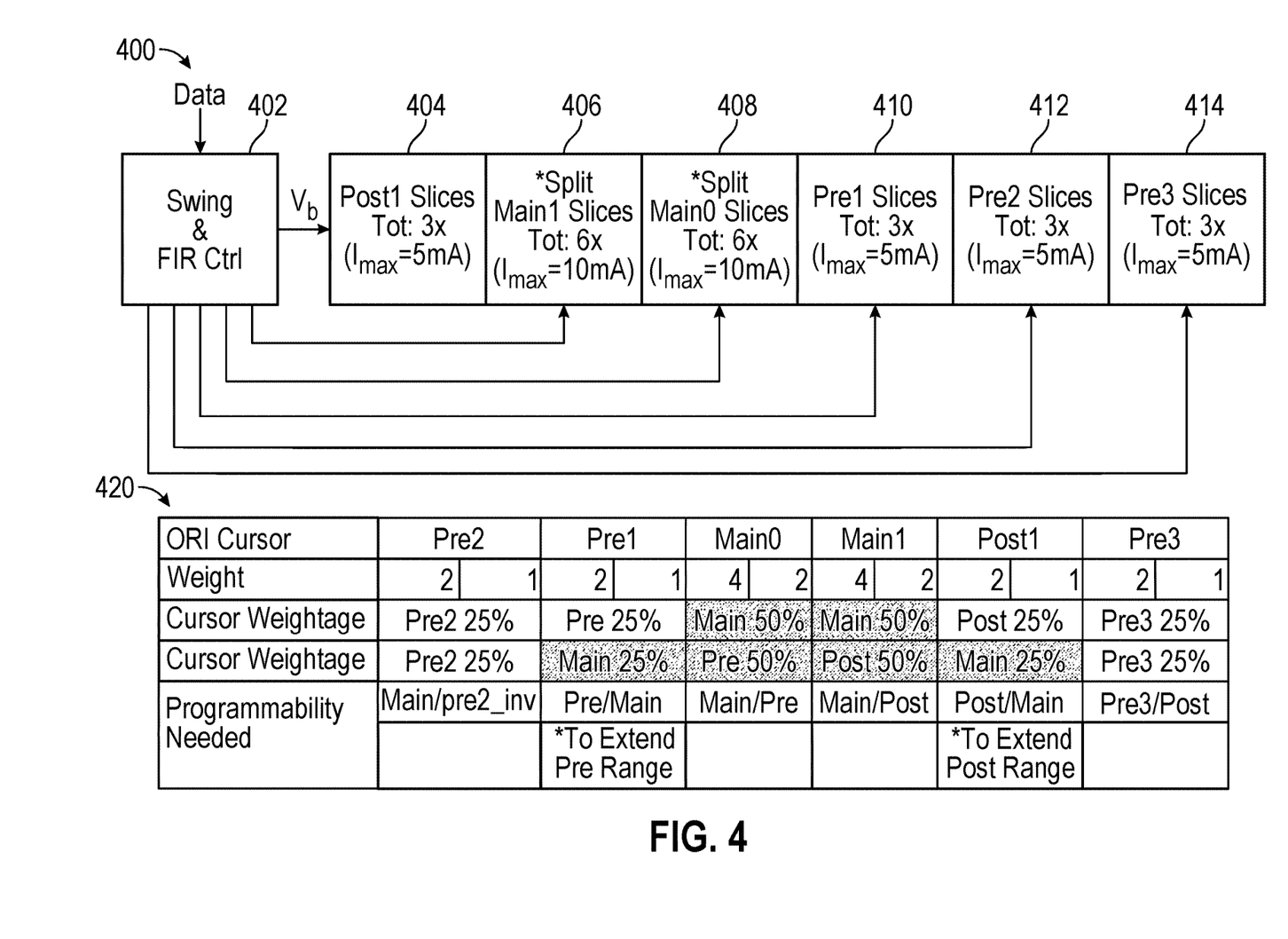
FIG. 4 is a block diagram and a table illustrating a transmit driver architecture with programmable configurability for extended equalization range, according to certain aspects of the present disclosure.

As original cursors (labeled "ORI Cursor" in table 420) before any swapping, the main cursor slices 408, 406 may use double the current (and have twice the cursor weightage) as the precursor slices 410, 412, 414 and the postcursor slice 404. For example, the main cursor weightage may be 50%, whereas the precursor and postcursor weightage may be 25% (so half). Table 420 also illustrates in the row labeled "Weight" that for a PAM4 implementation as described above, the most significant bit (MSB) is weighted twice as much as the least significant bit (LSB). In the "Weight" row of table 420 for each cursor slice, the left column represents the relative weight for the MSB, whereas the right column represents the relative weight for the LSB.

To achieve an equalization range of up to 0.40, a programmable design technique may be implemented as illustrated in the table 420 of FIG. 4. With this programmable design, a precursor slice (e.g., Pre1) and/or a postcursor slice (e.g., Post1) can be configured as one of the main cursor slices, and one of the main cursor slices can instead be configured as a precursor or postcursor slice. Thus, precursor slice 410 (Pre1) can function as a main cursor slice with a 25% cursor weightage (rather than the nominal 50% cursor weightage for a main cursor slice), and/or postcursor slice 404 (Post1) can function as a main cursor slice with a 25% cursor weightage. In addition, main cursor slice 408 can function as a precursor slice with a 50% cursor weightage (rather than the nominal 25% cursor weightage for a precursor slice), and/or main cursor slice 408 can function as a postcursor slice with a 50% cursor weightage (rather than the nominal 25% cursor weightage for a postcursor slice). Because the main cursor slices 406, 408 support a higher amount of current, this programmability feature allows the transmit driver architecture to achieve a 0.40 level of equalization without using additional cursor slices, thereby saving power and area, while still allowing the design to maintain easy configurability. This programmable configurability of the cursor slices may be controlled by the control module 402 and may depend on properties of a system in which the transmit driver circuit resides.

Example TX Driver Operations

Figure 5:
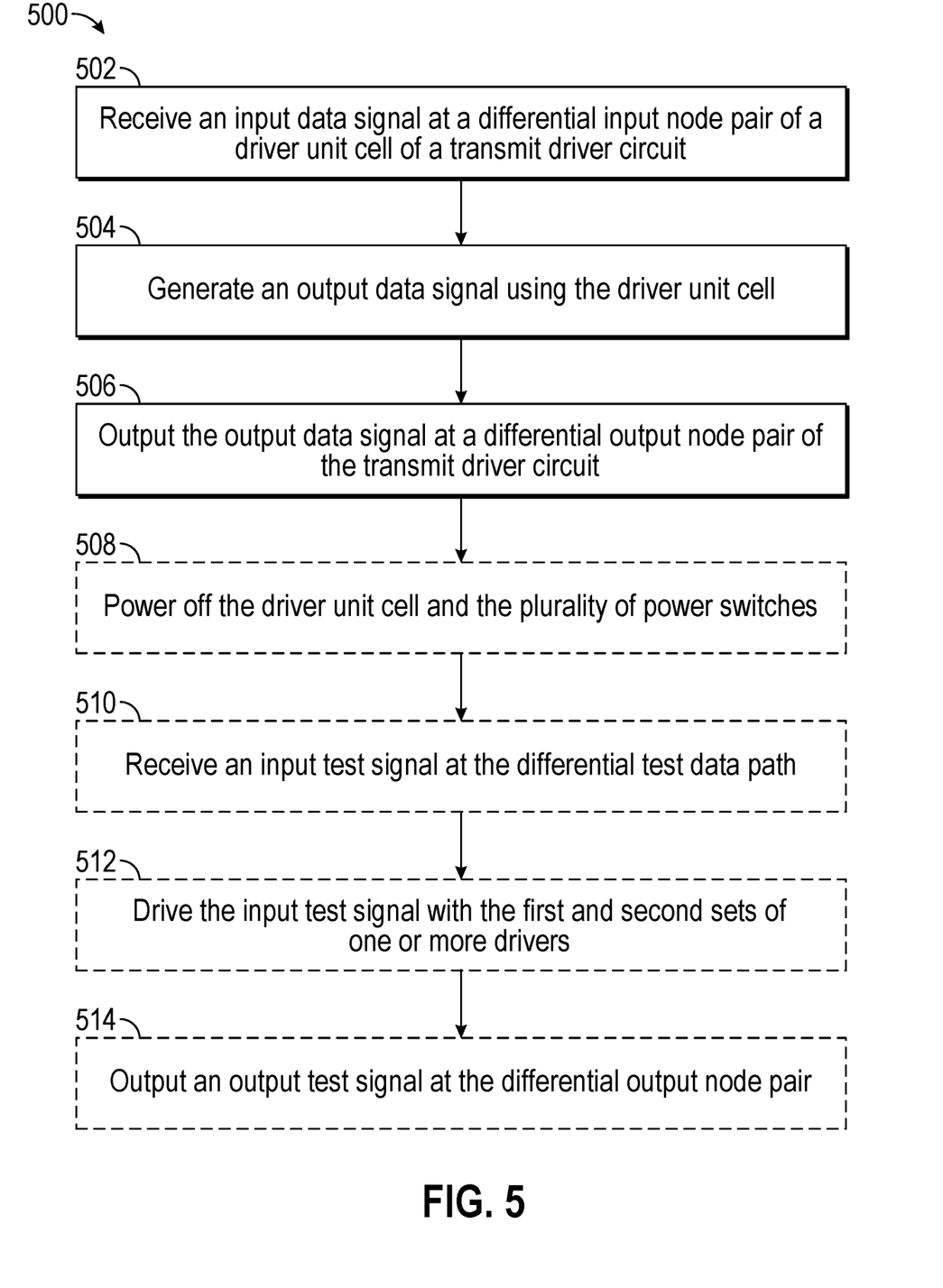
FIG. 5 is a flow diagram of example operations for driving data, according to certain aspects of the present disclosure.

FIG. 5 is a flow diagram of example operations 500 for driving data, according to certain aspects of the present disclosure. The operations 500 may be performed by a transmit driver circuit (e.g., the transmit driver circuit 300 or 350).

The operations 500 may begin, at block 502, by receiving an input data signal at a differential input node pair (e.g., differential input node pair Vinp/Vinn) of a driver unit cell (e.g., driver unit cell(s) 204) of the transmit driver circuit. At block 504, the transmit driver circuit may generate an output data signal using the driver unit cell and output, at block 506, the output data signal at a differential output node pair (e.g., differential output node pair txp/txn) of the transmit driver circuit. The transmit driver circuit includes a plurality of power switches (e.g., power switches 306) coupled between the differential output node pair and one or more power supply rails (e.g., power supply rail(s) 311, 351); a first set (e.g., JTAG input circuit $302_0$) of one or more drivers (e.g., inverters 304) coupled between a first test node (e.g., node dslow) of a differential test data path and a first output node (e.g., node txp) of the differential output node pair; and a second set (e.g., JTAG input circuit $302_1$) of one or more drivers (e.g., inverters 304) coupled between a second test node (e.g., node dslow_b) of the differential test data path and a second output node (e.g., node txn) of the differential output node pair.

According to certain aspects, the operations 500 may further involve powering off the driver unit cell and the plurality of power switches at block 508. For certain aspects, the transmit driver circuit may receive an input test signal at the differential test data path at block 510, drive the input test signal with the first and second sets of one or more drivers at block 512, and output an output test signal at the differential output node pair at block 514, while the driver unit cell and the plurality of power switches are powered off (e.g., as in FIG. 3B). In this case, the input test signal may include a Joint Test Action Group (JTAG) signal.

According to certain aspects, the plurality of power switches includes a first switch (e.g., transistor M7) coupled between a first power supply rail (e.g., power supply rail 311) of the one or more power supply rails and the first output node of the differential output node pair; a second switch (e.g., transistor M9) coupled between a second power supply rail (e.g., power supply rail 351) of the one or more power supply rails and the first output node of the differential output node pair, wherein the first power supply rail has a first voltage (e.g., avccaux=1.5 V) different from a second voltage (e.g., avtt=1.2 V) of the second power supply rail; a third switch (e.g., transistor M8) coupled between the first power supply rail and the second output node of the differential output node pair; and a fourth switch (e.g., transistor M10) coupled between the second power supply rail and the second output node of the differential output node pair. In this case, generating the output data signal may involve powering the transmit driver circuit with the first and third switches closed and with the second and fourth switches open. Based on a swing condition (e.g., a low swing scenario) of the transmit driver circuit, the transmit driver circuit may change to being powered with the second and fourth switches closed and with the first and third switches open.

According to certain aspects, the operations 500 further include generating the input data signal based on two main cursors (e.g., main cursor slices 406, 408), one postcursor (e.g., postcursor slice 404), and three precursors (e.g., precursor slices 410, 412, 414) for equalization. In this case, generating the input data signal may include at least one of: programming a first one of the main cursors (e.g., Main0) to function as one of the precursors (e.g., Pre1) with a higher cursor weightage (e.g., 50%) than a nominal cursor weightage (e.g., 25%) for the one of the precursors; programming a second one of the main cursors (e.g., Main1) to function as the postcursor (e.g., Post1) with a higher cursor weightage (e.g., 50%) than a nominal cursor weightage (e.g., 25%) for the postcursor; programming the one of the precursors (e.g., Pre1) to function as the first one of the main cursors with a lower cursor weightage (e.g., 25%) than a nominal cursor weightage (e.g., 50%) for the first one of the main cursors; or programming the postcursor to function as the second one of the main cursors (e.g., with a lower cursor weightage than a nominal cursor weightage for the second one of the main cursors.

Example Programmable Integrated Circuits

The transmit driver architecture described herein may be implemented in the transmit driver of a serializer/deserializer (SerDes) system, for example. A SerDes transmitter (e.g., SerDes transmitter 104) may be included in any of various suitable devices or systems, such as an integrated circuit (IC) or module.

One type of IC that may utilize one or more SerDes transmit drivers (e.g., SerDes transmitter 104) is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 6:
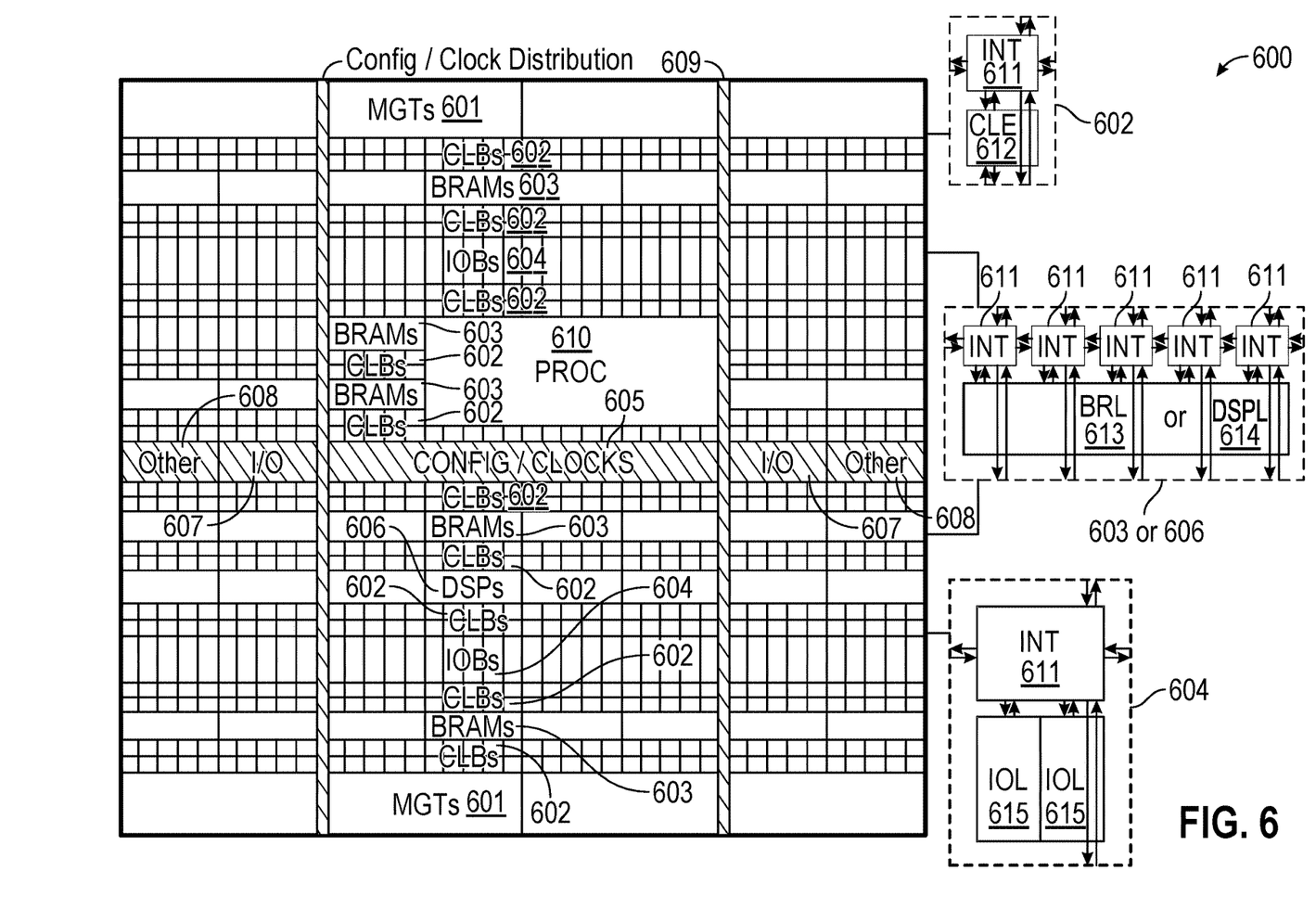
FIG. 6 is a block diagram illustrating an example architecture for a programmable device, in which aspects of the present disclosure may be practiced.

FIG. 6 is a block diagram illustrating an example architecture 600 for a programmable device. The architecture 600 may be implemented within a field programmable gate array (FPGA), for example. As shown, the architecture 600 includes several different types of programmable circuitry (e.g., logic blocks). For example, the architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far right of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An IOB 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example architecture 600 depicted in FIG. 1, a horizontal area near the center of the die (shown shaded in FIG. 6) is used for configuration, clock, and other control logic (CONFIG/CLOCKS 105). Other vertical areas 609 extending from this central area may be used to distribute the clocks and configuration signals across the breadth of the FPGA.

Some FPGAs utilizing the architecture 600 illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture 600 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A transmit driver circuit comprising:
   one or more driver unit cells having a differential input node pair configured to receive an input data signal and having a differential output node pair configured to output an output data signal;
   a plurality of power switches coupled between the differential output node pair and one or more power supply rails;
   a first set of one or more drivers coupled between a first test node of a differential test data path and a first output node of the differential output node pair; and
   a second set of one or more drivers coupled between a second test node of the differential test data path and a second output node of the differential output node pair.

2. The transmit driver circuit of claim 1, wherein the differential test data path comprises a Joint Test Action Group (JTAG) data path.

3. The transmit driver circuit of claim 1, wherein the one or more driver unit cells and the plurality of power switches are configured to be powered off during a test mode for the transmit driver circuit, such that the transmit driver circuit is configured to function as a voltage-mode driver during the test mode.

4. The transmit driver circuit of claim 1, further comprising:
   a first set of one or more resistive elements coupled between an output of the first set of one or more drivers and the first output node of the differential output node pair; and
   a second set of one or more resistive elements coupled between an output of the second set of one or more drivers and the second output node of the differential output node pair.

5. The transmit driver circuit of claim 4, wherein at least one of the first set or the second set of one or more resistive elements comprises a switched array of resistive elements.

6. The transmit driver circuit of claim 1, wherein the plurality of power switches comprises:
   a first switch coupled between a first power supply rail of the one or more power supply rails and the first output node of the differential output node pair;
   a second switch coupled between a second power supply rail of the one or more power supply rails and the first output node of the differential output node pair, wherein the first power supply rail has a first voltage different from a second voltage of the second power supply rail;
   a third switch coupled between the first power supply rail and the second output node of the differential output node pair; and
   a fourth switch coupled between the second power supply rail and the second output node of the differential output node pair.

7. The transmit driver circuit of claim 1, wherein the first and second sets of one or more drivers each comprise a plurality of inverters coupled in series.

8. The transmit driver circuit of claim 1, further comprising a control module configured to generate the input data signal based on two main cursors, one postcursor, and three precursors for equalization.

9. The transmit driver circuit of claim 8, wherein the control module is configured to program one of the precursors to function as one of the main cursors with a lower cursor weightage than a nominal cursor weightage for the one of the main cursors.

10. The transmit driver circuit of claim 8, wherein the control module is configured to program the postcursor to function as one of the main cursors with a lower cursor weightage than a nominal cursor weightage for the one of the main cursors.

11. The transmit driver circuit of claim 8, wherein the control module is configured to program a first one of the main cursors to function as one of the precursors with a higher cursor weightage than a nominal cursor weightage for the one of the precursors.

12. The transmit driver circuit of claim 11, wherein the control module is configured to program a second one of the main cursors to function as the postcursor with a higher cursor weightage than a nominal cursor weightage for the postcursor.

13. A programmable integrated circuit (IC) comprising a serial/deserializer, wherein the serial/deserializer comprises the transmit driver circuit of claim 1.

14. A method of driving data, comprising:
receiving an input data signal at a differential input node pair of a driver unit cell of a transmit driver circuit;
generating an output data signal using the driver unit cell; and
outputting the output data signal at a differential output node pair of the transmit driver circuit, wherein the transmit driver circuit comprises:
a plurality of power switches coupled between the differential output node pair and one or more power supply rails;
a first set of one or more drivers coupled between a first test node of a differential test data path and a first output node of the differential output node pair; and
a second set of one or more drivers coupled between a second test node of the differential test data path and a second output node of the differential output node pair.

15. The method of claim 14, further comprising:
powering off the driver unit cell and the plurality of power switches;
receiving an input test signal at the differential test data path;
driving the input test signal with the first and second sets of one or more drivers; and
outputting an output test signal at the differential output node pair while the driver unit cell and the plurality of power switches are powered off.

16. The method of claim 15, wherein the input test signal comprises a Joint Test Action Group (JTAG) signal.

17. The method of claim 14, wherein the plurality of power switches comprises:

a first switch coupled between a first power supply rail of the one or more power supply rails and the first output node of the differential output node pair;
a second switch coupled between a second power supply rail of the one or more power supply rails and the first output node of the differential output node pair, wherein the first power supply rail has a first voltage different from a second voltage of the second power supply rail;
a third switch coupled between the first power supply rail and the second output node of the differential output node pair; and
a fourth switch coupled between the second power supply rail and the second output node of the differential output node pair.

18. The method of claim 17, wherein generating the output data signal comprises:
powering the transmit driver circuit with the first and third switches closed and with the second and fourth switches open; and
based on a swing condition of the transmit driver circuit, changing to powering the transmit driver circuit with the second and fourth switches closed and with the first and third switches open.

19. The method of claim 14, further comprising generating the input data signal based on two main cursors, one postcursor, and three precursors for equalization, wherein generating the input data signal comprises at least one of:
programming a first one of the main cursors to function as one of the precursors with a higher cursor weightage than a nominal cursor weightage for the one of the precursors;
programming a second one of the main cursors to function as the postcursor with a higher cursor weightage than a nominal cursor weightage for the postcursor;
programming the one of the precursors to function as the first one of the main cursors with a lower cursor weightage than a nominal cursor weightage for the first one of the main cursors; or
programming the postcursor to function as the second one of the main cursors with a lower cursor weightage than a nominal cursor weightage for the second one of the main cursors.

\* \* \* \* \*